(12) United States Patent
Azumano (10) Patent No.: US 11,387,083 B2
(45) Date of Patent: Jul. 12, 2022

(54) PLASMA PROCESSING APPARATUS

(71) Applicant: Shibaura Mechatronics Corporation, Yokohama (JP)

(72) Inventor: Hidehito Azumano, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 322 days.

(21) Appl. No.: 16/581,859

(22) Filed: Sep. 25, 2019

(65) Prior Publication Data

US 2020/0105507 A1    Apr. 2, 2020

(30) Foreign Application Priority Data

Sep. 28, 2018    (JP) .............................. JP2018-183465

(51) Int. Cl.
    *H01J 37/32*    (2006.01)
    *H01L 21/67*    (2006.01)

(52) U.S. Cl.
    CPC .... *H01J 37/32834* (2013.01); *H01J 37/3244* (2013.01); *H01J 37/32715* (2013.01); *H01L 21/67069* (2013.01); *H01J 37/32183* (2013.01); *H01J 2237/002* (2013.01); *H01J 2237/186* (2013.01); *H01J 2237/1825* (2013.01); *H01J 2237/334* (2013.01)

(58) Field of Classification Search
    USPC ..................................... 156/345.51; 118/728
    See application file for complete search history.

(56) References Cited

U.S. PATENT DOCUMENTS

| | | | |
|---|---|---|---|
| 5,948,704 A | 9/1999 | Benjamin | |
| 6,972,071 B1 * | 12/2005 | Tyler | H01J 37/32357 118/715 |
| 8,552,334 B2 * | 10/2013 | Tappan | H01L 21/6719 219/121.48 |
| 8,900,404 B2 * | 12/2014 | Tappan | H01J 37/32623 156/345.43 |
| 9,728,379 B2 * | 8/2017 | Zhang | H01L 21/6831 |
| 2009/0200268 A1 | 8/2009 | Tappan et al. | |
| 2013/0087286 A1 | 4/2013 | Carducci et al. | |

(Continued)

FOREIGN PATENT DOCUMENTS

| | | |
|---|---|---|
| JP | 2000-511700 A | 9/2000 |
| JP | 2011-511474 A | 4/2011 |
| JP | 2013-084602 A | 5/2013 |

(Continued)

*Primary Examiner* — Ram N Kackar
(74) *Attorney, Agent, or Firm* — Pearne & Gordon LLP (57) ABSTRACT

According to one embodiment, a plasma processing apparatus includes a chamber, a plasma generator, a gas supplier supplying, a placement part, a depressurization part, and a supporting part. The supporting part includes a mounting part positioned below the placement part and provided with the placement part, and a beam extending from a side surface of the chamber toward a center axis of the chamber. One end of the beam is connected to a side surface of the mounting part. The beam includes a space connected to an outside space of the chamber. A following formula is satisfied, t1>t2, when a thickness of a side portion on the placement part side of side portions of the beam is taken as t1, a thickness of a side portion on an opposite side of the placement part side of the beam is taken as t2.

13 Claims, 4 Drawing Sheets

(56) References Cited

U.S. PATENT DOCUMENTS

2014/0342568 A1* 11/2014 Sant ................. H01J 37/321
                                                                438/710
2018/0061616 A1    3/2018  Nichols et al.

FOREIGN PATENT DOCUMENTS

| TW | 200943457 A1 | 10/2009 |
|----|--------------|---------|
| TW | 201820380 A  | 6/2018  |
| WO | 2009/099660 A2 | 8/2009 |

\* cited by examiner

PLASMA PROCESSING APPARATUS

CROSS-REFERENCE TO RELATED APPLICATIONS

This application is based upon and claims the benefit of priority from Japanese Patent Application No. 2018-183465, filed on Sep. 28, 2018; the entire contents of which are incorporated herein by reference.

BACKGROUND

Field

Embodiments described herein relate generally to a plasma processing apparatus.

Description of the Related Art

In a plasma processing apparatus used for dry etching, CVD, PVD, etc., improvement of plasma processing performance is required. Therefore, when exhausting the inside of the chamber, it is preferable that the effective pumping speed is large and axisymmetric exhaust without deviation is performed.

When by-products generated in the plasma processing remain inside the chamber, the plasma processing performance results in fluctuation. Therefore, maintenance is needed that the inside of the chamber is cleaned regularly and parts with adhered by-products are exchanged. In this case, if a placement part on which a processed product is placed is fixed to a bottom surface of the chamber, it becomes difficult to take the placement part out of the chamber, and the maintenance of the chamber becomes difficult.

Then, the plasma processing apparatus has been proposed which includes a cantilever structure module with a beam protruding into the chamber from the side surface of the chamber and provided with the placement part on a tip side of the beam, and a turbo molecular pump provided immediately below the placement part (for example, see Patent Document 1).

In this way, since the placement part can be provided in an internal space of the chamber, a depressurization part can be disposed immediately below the placement part. If the depressurization part is disposed immediately below the placement part, axisymmetric exhaust with a large effective pumping speed and without deviation is easy to be performed. In this structure, the placement part can be taken out from the side surface side of the chamber. Therefore, the maintenance of the chamber becomes easy compared with the case where the placement part is fixed to the bottom surface of the chamber.

However, an electrode made of a metal is provided on the placement part, and thus the placement part is heavier. Therefore, there is a risk that the tip of the beam supporting the placement part bends downward and the placement part tilts. If the placement part with a large plane dimension tilts, there is a risk that a gas flow and a plasma density in the chamber are non-uniform and processing characteristics is non-uniform.

In this case, if a section dimension of the beam is made large, there is a risk that the effective pumping speed is reduced and the axisymmetric exhaust without deviation becomes difficult. If the number of the beam is increased, it becomes difficult to detach the placement part from the chamber in the maintenance.

Then, it has been desired to develop a plasma processing apparatus which can suppress the placement part from tilting with a simple configuration.

PRIOR ART DOCUMENT

Patent Document

Patent Document 1 JP 2000-511700 A

SUMMARY

According to an embodiment, a plasma processing apparatus includes a chamber being possible to maintain an atmosphere more depressurized than atmospheric pressure, a plasma generator generating a plasma inside the chamber, a gas supplier supplying a gas into the chamber, a placement part, the placement part being positioned below a region where the plasma is generated, a processed product being placed on the placement part, a depressurization part positioned below the placement part and depressurizing inside of the chamber, and a supporting part supporting the placement part in an internal space of the chamber. The supporting part includes a mounting part, the mounting part being positioned below the placement part and being provided with the placement part, and a beam extending from a side surface of the chamber toward a center axis of the chamber inside the chamber. One end of the beam is connected to a side surface of the mounting part. A space is included inside the beam. The space is connected to an outside space of the chamber. A following formula is satisfied, t1>t2, when a thickness of a side portion on the placement part side of side portions of the beam is taken as t1, a thickness of a side portion on an opposite side of the placement part side of the beam is taken as t2.

DETAILED DESCRIPTION

Various embodiments are described below with reference to the accompanying drawings.

In the drawings, similar components are marked with like reference numerals, and a detailed description is omitted as appropriate.

Figure 1:
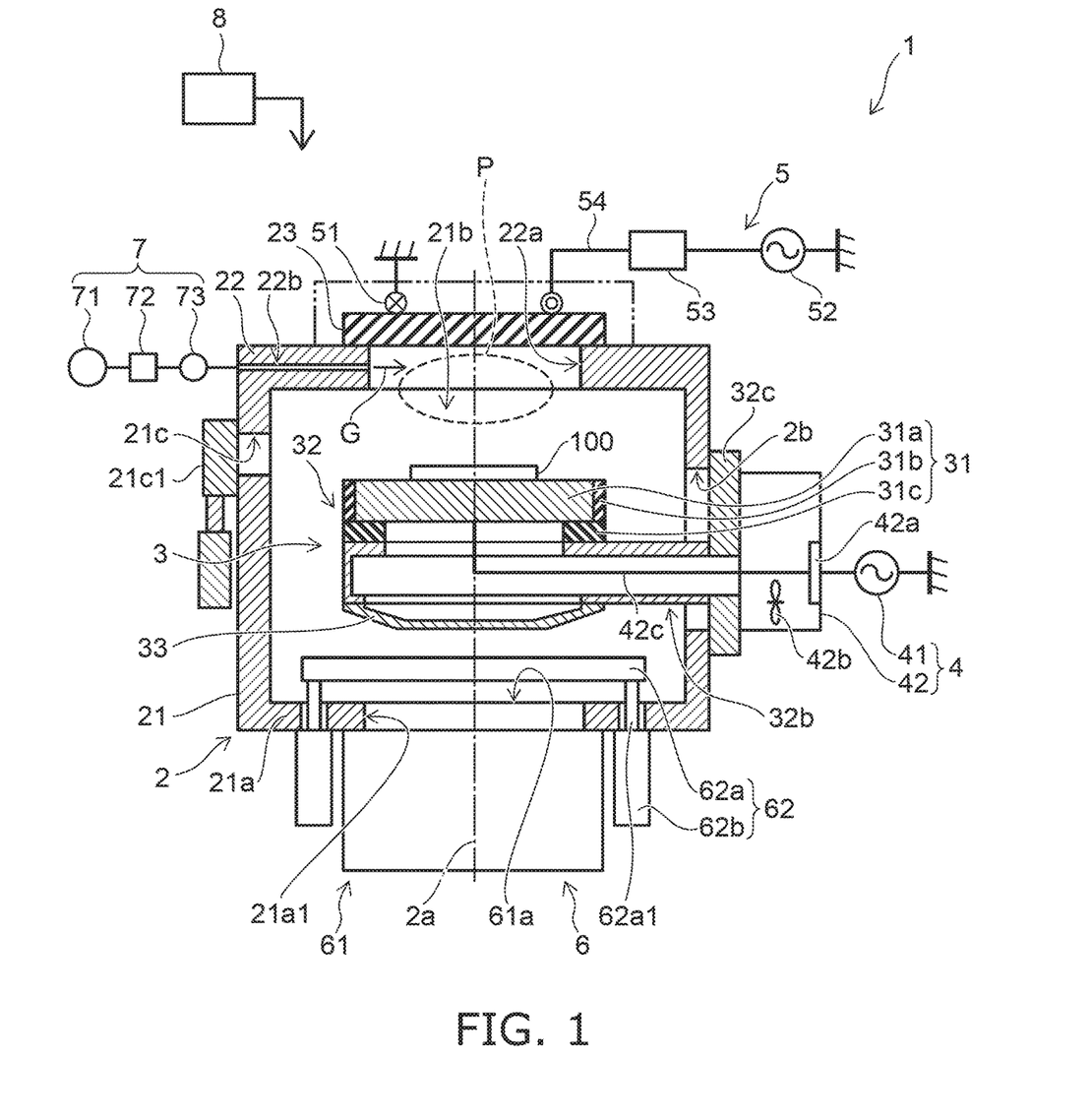
FIG. 1 is a schematic cross sectional view for illustrating a plasma processing apparatus according to the embodiment.

FIG. 1 is a schematic cross sectional view for illustrating a plasma processing apparatus 1 according to the embodiment.

As shown in FIG. 1, the plasma processing apparatus 1 includes a chamber 2, a placement module 3, a power supply part 4, a power supply part 5, a depressurization part 6, a gas supplier 7, and a controller 8.

The chamber 2 has an airtight structure which is possible to maintain an atmosphere more depressurized than an atmospheric pressure.

The chamber 2 includes a main body part 21, a top board 22, and a window 23.

The main body part 21 presents an almost cylindrical shape, and a bottom plate 21a is provided integrally on one end. Other end of the main body part 21 is open. The main body part 21 can be formed of, for example, a metal such as an aluminum alloy. The main body part 21 can be grounded. A region 21b where plasma P is generated is provided inside the main body part 21. The main body part 21 is provided with a carry-in-and-out port 21c for carrying in and out a processed product 100. The carry-in-and-out port 21c is configured to be closed tightly by a gate valve 21c1.

The processed product 100 can be, for example, a photomask, a mask blank, a wafer, a glass substrate or the like. However, the processed product 100 is not limited to the illustration.

The top board 22 presents a plate shape, and is provided to close the opening of the main body part 21. The top plate 22 can be provided to confront the bottom plate 21a. A hole 22a piercing in a thickness direction is provided in a center region of the top board 22. The center of the hole 22a can be provided on a center axis 2a of the chamber 2 (main body part 21). The hole 22a is provided so that an electromagnetic wave radiated from an electrode 51 is transmitted. The top board 22 can be formed of, for example, a metal such as an aluminum alloy.

The window 23 presents a plate shape, and is provided on the top board 22. The window 23 is provided to close the hole 22a. The window 23 can transmit the electromagnetic wave, and is formed of a material which is hard to be etched when an etching process is performed. The window 23 can be formed of, for example, a dielectric material such as quartz.

The placement module 3 includes a placement part 31, a supporting part 32, and a cover 33.

The processed product 100 is placed on the placement part 31. The placement part 31 is positioned below the region 21b where the plasma P is generated. The placement module 3 has a cantilever structure protruding into the chamber 2 (main body part 21) from a side surface of the chamber 2 (main body part 21) and being provided with the placement part 31 on the tip side (see FIG. 1).

The detail of the placement module 3 will be described later.

The power supply part 4 includes a power supply 41 and a matching part 42.

The power supply part 4 is a so called high frequency power supply for bias control. That is, the power supply part 4 is provided in order to control energy of ions attracted to the processed product 100 on the placement part 31.

The power supply 41 outputs a high frequency power having a frequency suitable for attracting ions (for example, frequency of 27 MHz to 1 MHz).

The matching part 42 includes a matching circuit 42a and a fan 42b.

The matching circuit 42a is provided in order to match between impedance on the power supply 41 side and impedance on the plasma P side. The matching circuit 42a is electrically connected to the power supply 41 and an electrode 31a via a wire member (bus bar) 42c.

The fan 42b sends air into the supporting part 32. The fan 42b is provided in order to cool the wire member 42c and/or the matching circuit 42a provided inside the supporting part 32.

The matching part 42 can be provided on a flange 32c of the supporting part 32. If the matching part 42 is provided on the flange 32c, the placement module 3 and the matching part 42 can be moved integrally when detaching the placement module 3 from the chamber 2 (main body part 21) or attaching the placement module 3 to the chamber 2 (main body part 21). Therefore, the maintainability can be improved.

An internal space of the beam 32b is connected to an outside space of the chamber 2 (main body part 21) via the matching part 42. Therefore, the pressure of the internal space of the beam 32b is the same as the pressure (for example, atmospheric pressure) of the outside space of the chamber 2.

The power supply part 5 includes the electrode 51, a power supply 52, and a matching circuit 53.

The power supply part 5 can be a high frequency power supply for generating the plasma P. That is, the power supply part 5 is provided in order to generate the plasma P by causing a high frequency discharge inside the chamber 2.

In the embodiment, the power supply part 5 serves as a plasma generator generating the plasma P inside the chamber 2.

The electrode 51 is provided on the window 23 outside the chamber 2. The electrode 51 can include multiple conductor parts generating electromagnetic field and multiple capacity parts (capacitor).

The power supply 52 outputs a high frequency power having a frequency of approximately 100 KHz to 100 MHz. In this case, the power supply 52 can output a high frequency power having a frequency suitable for generating the plasma P (for example, frequency of 13.56 MHz). The power supply 52 can change the frequency of the output high frequency power as well.

The matching circuit 53 is provided in order to match between impedance on the power supply 52 side and impedance on the plasma P side. The matching circuit 53 is electrically connected to the power supply 52 and the electrode 51 via a wire 54. The matching circuit 53 can be electrically connected to the power supply 52 and the electrode 51 via the bus bar 42c as well.

The plasma processing apparatus 1 illustrated in FIG. 1 is a double frequency plasma processing apparatus including an inductively coupled electrode at the top and a capacitively coupled electrode at the lower part.

However, a generation method of plasma is not limited to the illustration.

The plasma processing apparatus 1 may be, for example, a plasma processing apparatus based on inductively coupled plasma (ICP) and/or a plasma processing apparatus based on capacitively coupled plasma (CCP) or the like.

The depressurization part 6 includes a pump 61 and a valve 62.

The depressurization part 6 is positioned below the placement part 31, and depressurizes the inside of the chamber 2 to a prescribed pressure.

The pump 61 can be provided outside the chamber 2. The pump 61 can be connected to a hole 21a1 (corresponding to one example of a second hole) provided on the bottom plate 21a of the chamber 2. The pump 61 exhausts the gas inside the chamber 2. The pump 61 can be, for example, a turbo molecular pump (TMP) or the like.

The valve 62 includes a valve disc 62a and a drive part 62b.

The valve disc 62a presents a plate shape, and is provided inside the chamber 2. The valve disc 62a confronts the hole 21a1. A plane dimension of the valve disc 62a can be larger than a plane dimension of an inlet 61a. When viewing the valve disc 62a in a direction of the center axis 2a, the valve disc 62a covers the inlet 61a of the pump 61.

The drive part 62*b* changes the position of the valve disc 62*a* in the direction of the center axis 2*a* of the chamber 2 (main body part 21). That is, the drive part 62*b* raises the valve disc 62*a* and/or lowers the valve disc 62*a*. The drive part 62*b* can include a shaft 62*a*1 connected to the valve disc 62*a* and a control motor (for example, servo motor, etc.) moving the shaft 62*a*1. The valve 62 can be a so called poppet valve.

Here, when the position of the valve disc 62*a* changes inside the camber 2, a distance between the valve disc 62*a* and the bottom plate 21*a* of the chamber 2 changes. The space between the valve disc 62*a* and the bottom plate 21*a* of the chamber 2 serves as an exhaust flow path. Therefore, since conductance changes when the dimension of this portion is changed, an exhaust amount and/or a pumping speed or the like can be controlled. The drive part 62*b* can control, for example, the position of the valve disc 62*a* on the basis of the output of a not shown vacuum gauge, etc. which detects an internal pressure of the chamber 2.

The gas supplier 7 includes a gas storage part 71, a gas controller 72, and an on-off valve 73.

The gas supplier 7 supplies gas G to the region 21*b* where the plasma P is generated inside the chamber 2. The gas storage part 71, the gas controller 72, and the on-off valve 73 can be provided outside the chamber 2.

The gas storage part 71 stores the gas G and supplies the stored gas G into the chamber 2. The gas storage part 71 can be, for example, a high pressure cylinder, etc. storing the gas G. The gas storage part 71 and the gas controller 72 are connected via a piping.

The gas controller 72 controls a flow rate and/or pressure, etc. when supplying the gas G from the gas storage part 71 into the chamber 2. The gas controller 72 can be, for example, MFC (Mass Flow Controller) or the like. The gas controller 72 and the on-off valve 73 are connected via a piping.

The on-off valve 73 is connected to a gas supply port 22*b* provided in the chamber 2 via a piping. The on-off valve 73 controls supply and stop of the gas G. The on-off valve 73 can be, for example, a 2 port electromagnetic valve, etc. The gas controller 72 also can have the function of the on-off valve 73.

When the gas G is excited and activated by the plasma P, desired radials and/or ions can be produced. For example, in the case where the gas G is subjected to the plasma processing such as etching processing, radicals and/or ions which can etch the exposed surface of the processed product 100 can be produced. In this case, the gas G can be, for example, a gas including chlorine and/or a gas including fluorine, etc. The gas G can be, for example, a mixed gas of chlorine gas and oxygen gas, $CHF_3$, a mixed gas of $CHF_3$ and $CF_4$, a mixed gas of $SF_6$ and Helium gas, etc.

The controller 8 includes an operation part such as CPU (Central Processing Unit) and a memory part such as a memory.

The controller 8 controls operations of components provided in the plasma processing apparatus 1 on the basis of a control program stored in the memory part. Since a well-known art can be applied to the control program controlling the operations of the components, the detailed description will be omitted.

Next, the placement module 3 will be further described.

Figure 2:
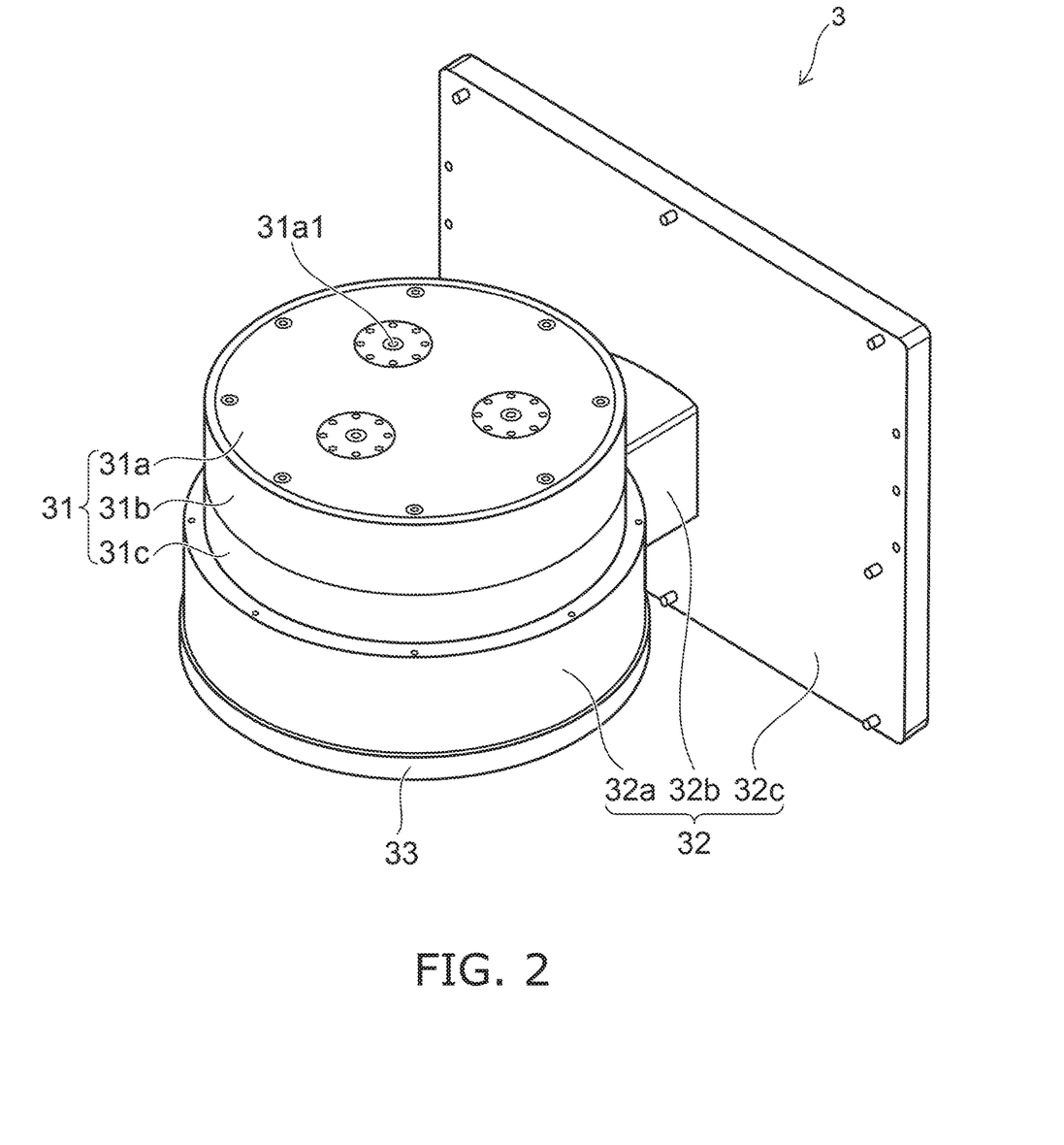
FIG. 2 is a schematic perspective view for illustrating a placement module.

FIG. 2 is a schematic perspective view for illustrating the placement module 3.

Figure 3:
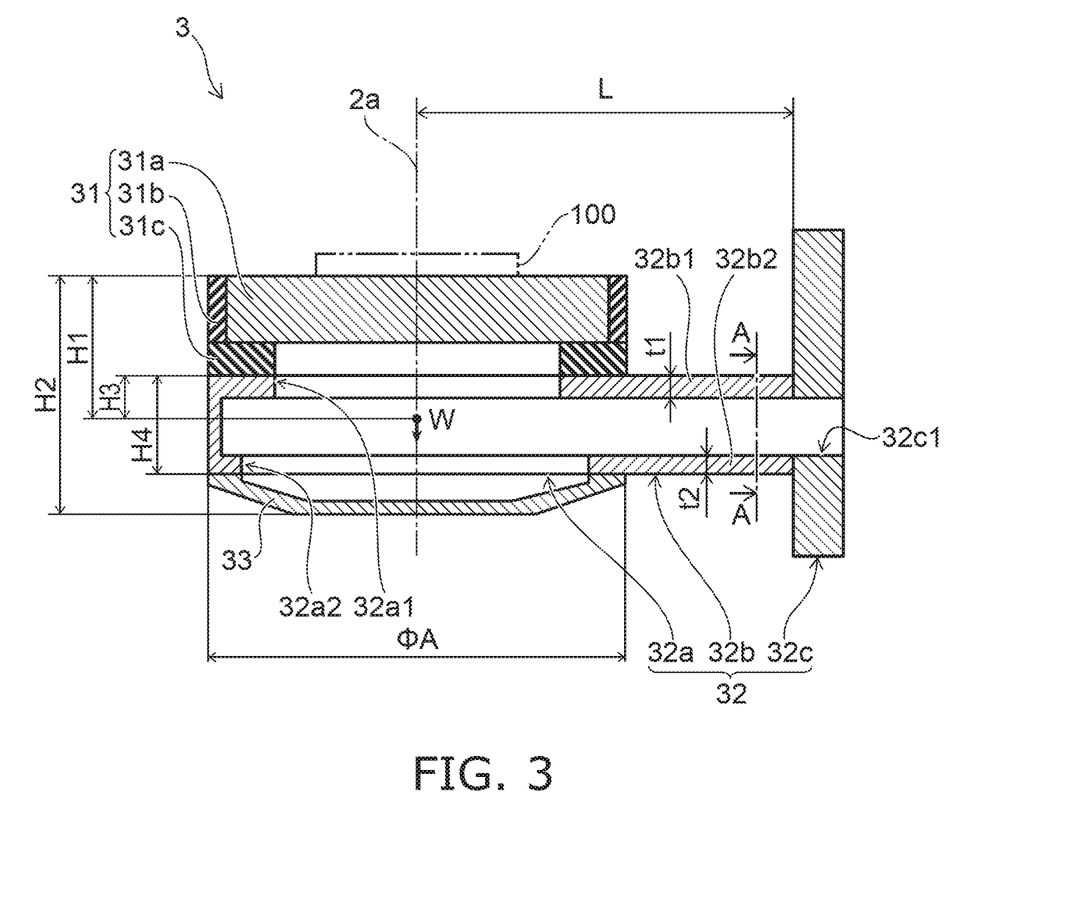
FIG. 3 is a schematic cross sectional view of the placement module.

FIG. 3 is a schematic cross sectional view of the placement module 3.

Figure 4:
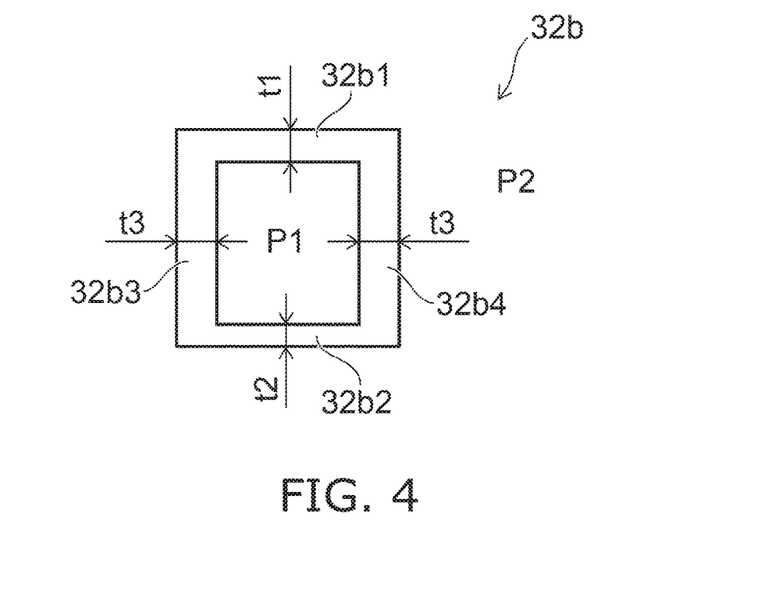
FIG. 4 is a schematic view for illustrating cross section of a beam.

FIG. 4 is a schematic view for illustrating cross section of the beam 32*b*. FIG. 4 is a schematic cross sectional view along A-A line direction of the beam 32*b* in FIG. 3.

Figure 5:
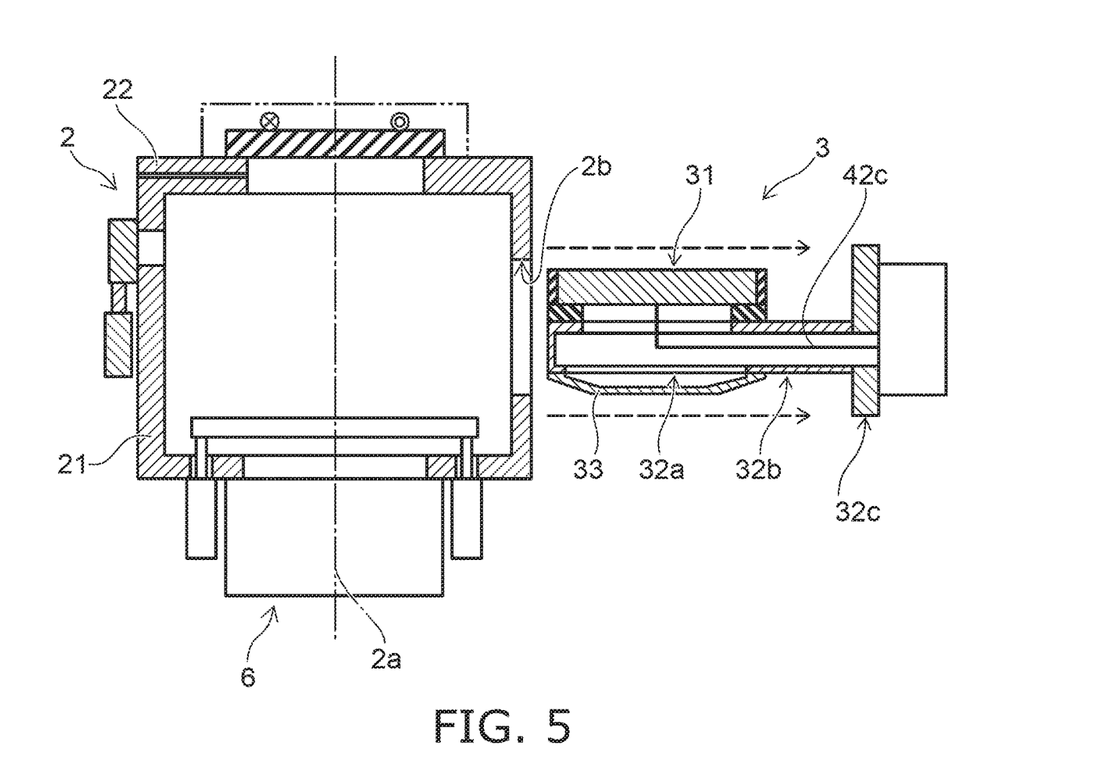
FIG. 5 is a schematic cross sectional view for illustrating detachment of the placement module.

FIG. 5 is a schematic cross sectional view for illustrating detachment of the placement module 3.

FIG. 5 omits the power supply part 4, the power supply part 5, the gas supplier 7, and the controller 8 or the like in order to avoid complications.

As shown in FIG. 2 and FIG. 3, the placement module 3 includes the placement part 31, the supporting part 32, and the cover 33.

The placement part 31 includes the electrode 31*a*, an insulating ring 31*b*, and a pedestal 31*c*.

The electrode 31*a* can be formed of a conductive material such as a metal. An upper surface of the electrode 31*a* can be a placement surface for placing the processed product 100. The electrode 31*a* can be, for example, screwed to the pedestal 31*c*. The electrode 31*a* can incorporate a pickup pin 31*a*1, and a temperature controller or the like. The pickup pin 31*a*1 can be provided multiply.

The multiple pickup pins 31*a*1 present a rod, and are provided enable to protrude from the upper surface of the electrode 31*a*. The multiple pickup pins 31*a*1 are used when delivering the processed product 100. Therefore, the multiple pickup pins 31*a*1 are protruded from the upper surface of the electrode 31*a* and pulled into the electrode 31*a* by a not shown drive part. The number and disposition of the multiple pickup pins 31*a*1 can be changed appropriately depending on a size and a planar shape, etc. of the processed product 100.

The temperature controller can be, for example, a circulation line (flow path) of a refrigerant and a heater or the like. The temperature controller controls, for example, the temperature of the electrode 31*a* and additionally the temperature of the processed product 100 placed on the electrode 31*a* on the basis of an output from a not shown temperature sensor.

The insulating ring 31*b* presents a ring shape, and covers a side surface of the electrode 31*a*. The insulating ring 31*b* can be formed of, for example, a dielectric material such as quartz.

The pedestal 31*c* is provided between the electrode 31*a* and a mounting part 32*a* of the supporting part 32. The pedestal 31*c* is provided in order to insulate the electrode 31*a* from the supporting part 32. The pedestal 31*c* can be formed of, for example, a dielectric material such as quartz. The pedestal 31*c* can be, for example, screwed to the mounting part 32*a* of the supporting part 32.

The supporting part 32 supports the placement part 31 in an internal space of the chamber 2. The supporting part 32 is disposed to extend between the side surface of the chamber 2 and the portion below the placement part 31.

The supporting part 32 includes the mounting part 32*a*, the beam 32*b*, and the flange 32*c*. The mounting part 32*a*, the beam 32*b*, and the flange 32*c* can be formed of, for example, an aluminum alloy, etc.

The mounting part 32*a* is positioned below the placement part 31 in the internal space of the chamber 2. The mounting part 32*a* can be provided so that the center of the mounting part 32*a* is positioned on the center axis 2*a* of the chamber 2. The mounting part 32*a* presents a cylindrical shape, a hole 32*a*1 is provided on an end face on the placement part 31 side, and a hole 32*a*2 is provided on an end face on an opposite side of the placement part 31 side. The wire member 42*c* and the piping for refrigerant or the like are connected to the electrode 31*a* via the hole 32*a*1. The hole 32*a*2 is used when connecting the wire member 42*c* and the piping for refrigerant or the like and maintaining the electrode 31a. The placement part 31 (pedestal 31c) is provided on the end face on the placement part 31 side of the mounting part 32a. Therefore, a planar shape of the mounting part 32a can be the same as a planar shape of the placement part 31. A plane dimension of the mounting part 32a can be approximately the same or slightly larger than a plane dimension of the placement part 31.

One end of the beam 32b is connected to a side surface of the mounting part 32a. Other end of the beam 32b is connected to the flange 32c via a hole 2b (corresponding to one example of a first hole) piercing the side surface of the chamber 2. The beam 32b extends in the internal space of the chamber 2 from the side surface of the chamber 2 toward the center axis 2a of the chamber 2. The beam 32b can present a square tube. The internal space of the beam 32b is connected to the outside space (atmospheric space) of the chamber 2 via a hole 32c1 provided in the flange 32c. If the internal space of the beam 32b is connected to the outside space of the chamber 2, a pressure of the internal space of the beam 32b is the same as a pressure (for example, atmospheric pressure) of the outside space of the chamber 2. The internal space of the beam 32b can be connected to an internal space of the mounting part 32a. In this case, a pressure of an internal space of the supporting part 32 is the same as the pressure (for example, atmospheric pressure) of the outside space of the chamber 2.

As shown in FIG. 1, the flange 32c is attached to an outer wall of the chamber 2. The hole 2b is provided on the side surface of the chamber 2. The hole 2b has a size and a shape through which the placement part 31 attached to the mounting part 32a can pass. Therefore, as shown in FIG. 5, the placement module 3 provided with the placement part 31 can be detached from the chamber 2 and the placement module 3 provided with the placement part 31 can be attached to the chamber 2 via the hole 2b. That is, it is possible to carry the mounting part 32a and the beam 32b provided with the placement part 31 in the chamber 2 and carry out from the chamber 2 via the hole 2b. A slider also can be provided on the outer wall of the chamber 2 in order to make it easy to attach and detach the placement module 3.

The flange 32c presents a plate, and includes the hole 32c1 piercing in a thickness direction (see FIG. 3). The flange 32c can be, for example, screwed to the outer wall of the chamber 2.

As shown in FIG. 3, the cover 33 is provided on the end face on the opposite side of the placement part 31 side of the mounting part 32a. The cover 33 can be, for example, screwed to the mounting part 32a. The hole 32a2 is closed tightly by attaching the cover 33 to the mounting part 32a. The shape of the cover 33 is not particularly limited, the cover 33 may be dome shaped, and may be plate shaped. The cover 33 can be formed of, for example, an aluminum alloy, etc.

Here, if the supporting part 32 has a cantilever structure, a space can be produced below the placement part 31 provided in the internal space of the chamber 2, and thus the depressurization part 6 can be disposed immediately below the placement part 31. If the depressurization part 6 is disposed immediately below the placement part 31, the effective pumping speed is large, and the axisymmetric exhaust without deviation is easily performed. If the supporting part 32 has a cantilever structure, it is able to detach the supporting part 32 provided with the placement part 31 from the chamber 2, and to attach the supporting part 32 provided with the placement part 31 to the chamber 2 in a horizontal direction. Therefore, compared with the case where the placement part is fixed to the bottom surface of the chamber 2, maintenance of the plasma processing apparatus becomes easy.

However, the electrode 31a made of a metal is provided on the placement part 31. The pickup pins 31a1 and its drive part, the temperature controller such as the circulation line of refrigerant and the heater or the like also are provided on the placement part 31. Therefore, the weight of the placement part increases. When the weight of the placement part 31 provided on the tip side of the supporting part 32 increases, the load is deviated due to being supported by one side, the tip of the beam 32b supporting the placement part 31 bends downward, and there is a risk that the placement part 31 tilts. For example, the weight of the placement part 31 may be approximately 56 to 70 kgf (weight kilogram). In such a case, the tip of the placement module 3 may lower downward by approximately 0.2 mm.

Since the processed product 100 is placed on the placement part 31, the placement surface for placing the processed product 100 needs an area not less than at least an area of main face of the processed product 100, and the plane dimension of the placement part 31 becomes large. Therefore, the placement part 31 with a large plane dimension tilts, there is a risk that a gas flow in the chamber 2 is disturbed, a plasma density is non-uniform, and processing characteristics are non-uniform.

In this case, if the cross sectional dimension of the beam 32b supporting the placement part 31 is increased in order to suppress the tilt of the placement part 31, there is a risk that the exhaust is disturbed, the effective pumping speed is decreased, and the axisymmetric exhaust without deviation becomes difficult. If the beam 32b supporting the placement part 31 is multiple, the cross sectional dimension of one beam 32b can be made small, and the effective pumping speed can be suppressed from decreasing. The axisymmetric exhaust without deviation also can be performed by arrangement of the multiple beams 32b. However, if the beam 32b supporting the placement part 31 is multiple, portions fixing the beams 32b to the side surface of the chamber 2 increase, and thus there is a risk that it becomes difficult to attach and detach the supporting part, and the maintainability is reduced.

Then, the supporting part 32 according to the embodiment is provided with the beam 32b having the space inside. As described previously, the internal space of the beam 32b and the outside space of the chamber 2 are connected. That is, a pressure P1 of the internal space of the beam 32b is the same as a pressure P2 (for example, atmospheric pressure) of the outside space of the chamber 2. As shown in FIG. 3 and FIG. 4, in the case where a thickness of a side portion (a side portion on upper side) 32b1 on the placement part 31 side of the beam 32b is taken as t1, and a thickness of a side portion (a side portion on lower side) 32b2 on the opposite side of the placement part 31 side of the beam 32b is taken as t2, "t1>t2".

Therefore, when performing the plasma processing, a uniform load depending on a difference between the pressure inside the beam 32b and the pressure outside the beam 32b is added to the side portions 32b1, 32b2 of the beam 32b. In this case, the uniform load applied to the side portion 32b1 of the beam 32b and the side portion 32b2 of the beam 32b is the same. Therefore, if "t1>t2", the deflection amount of the side portion 32b1 of the beam 32b is larger than the deflection amount of the side portion 32b2 of the beam 32b. As a result, since the tip of the beam 32b bends upward, it is possible to offset the downward deflection due to the weight of the placement part 31 by the upward deflection due to the pressure difference. Specific dimensions of the thicknesses t1, t2 can be appropriately determined by experiments and simulation.

Here, as shown in Table 1, the deflection of the beam 32*b* has been analyzed by a finite element analysis with addition of the weight of the placement part 31 as a condition, in the case where the thickness (t1) of the side portion 32*b*1 of the beam 32*b* and the thickness (t2) of the side portion 32*b*2 of the beam 32*b* are changed. In Table 1, the deflection amount in the case where the pressures outside and inside the beam 32*b* are the same (both are atmospheric pressure) is taken as "self-deflection", and the deflection amount in the case where the pressure (0.1 Pa) outside the beam 32*b* is lower than the atmospheric pressure and the pressure inside the beam 32*b* is the atmospheric pressure is taken as "load deflection".

TABLE 1

| No. | t1 | t2 | self-deflection | unit (mm) load deflection |
|---|---|---|---|---|
| 1 | 16 | 9 | −0.09 | 0.10 |
| 2 | 9 | 9 | −0.06 | −0.24 |
| 3 | 16 | 16 | −0.07 | −0.25 |
| 4 | 9 | 16 | −0.04 | −0.26 |

As a result, as in No. 1, while the beam 32*b* bends upward only under the condition of "t1>t2", as in No. 2 to 4, it is confirmed that the beam 32*b* bends downward under the both conditions of "t1=t2" and "t1<t2". This analysis results in that the beam 32*b* bends upward as in No. 1 with addition of only the weight of the placement part 31 as a condition, however the weight or the like of the product to be processed also is loaded practically, and thus the weight is further loaded. It is considered that the beam 32 bends downward by the further loaded weight and the upward deflection is offset, and then the placement surface of the placement part 31 becomes flat.

Table 2 shows a range of dimensions of the components of the plasma processing apparatus of the embodiment satisfying this condition. In this case, the beam 32*b* is formed of an aluminum alloy, and the pressure of the outside space of the beam 32*b* (internal pressure of the chamber 2) can be approximately 0.1 to 100 Pa.

L is a distance between the outer wall and the center axis of the chamber 2, φA is a diameter dimension of the placement surface on the placement part 31, H1 is a dimension from a center of gravity w to the placement surface, H2 is a dimension from the upper surface of the placement part 31 to the lower surface of the cover 33, H3 is a dimension from the center of gravity w to the upper side surface of the side portion 32*b*1, H4 is a dimension of the beam 32*b* in a vertical direction.

TABLE 2

| | range |
|---|---|
| L (mm) | 260~350 |
| φA (mm) | 315~450 |
| H1 (mm) | 100~150 |
| H2 (mm) | 280~360 |
| H3 (mm) | −10~20 |
| H4 (mm) | 80~110 |
| W (kgf) | 56~70 |
| t1 (mm) | 14~18 |
| t2 (mm) | 8~10 |

As shown in Table 2, for example, if L is approximately 260 to 350 mm and the weight of the placement part 31 is approximately 56 to 70 kgf (weight kilogram), t1=14 to 18 mm, t2=8 to 10 mm are available.

Here, as shown in FIG. 4, a thickness of side portions 32*b*3, 32*b*4 crossing the side portion 32*b*1 of the beam 32*b* is taken as t3. The uniform load applied to the side portion 32*b*3 and the side portion 32*b*4 of the beam 32*b* is equal. Therefore, if the thickness of the side portion 32*b*3 and the thickness of the side portion 32*b*4 are equal, the deflection of the side portion 32*b*3 and the deflection of the side portion 32*b*4 are offset. Therefore, the thickness t3 is not particularly limited. However, if the thickness t3 is too small, there is a risk that unintended deformation of the beam 32*b* occurs, and the position of the placement part 31 shifts. Therefore, "t1<t3" is preferable. If "t2<t3", the unintended deformation of the beam 32*b* is more easily suppressed.

Embodiments have been illustrated. However, the invention is not limited to the description.

An appropriate design modification by a person skilled in the art as embodiments also is within the scope of the invention to the extent that the spirit of the invention is included.

For example, the shape, the material, the disposition, etc. of the components included in the plasma processing apparatus 1 are not limited to illustrations and can be changed appropriately.

For example, the thickness of the mounting part 32*a* and the thickness of the beam 32*b* may be different. The beam 32*b* may present a cylindrical shape.

The components included in the embodiments described above can be combined within the extent of feasibility, and the combinations are included in the scope of the invention to the extent that the feature of the invention is included.

What is claimed is:

1. A plasma processing apparatus, comprising:
    a chamber being possible to maintain an atmosphere more depressurized than atmospheric pressure;
    a plasma generator generating a plasma inside the chamber;
    a gas supplier supplying a gas into the chamber;
    a placement part, the placement part being positioned below a region where the plasma is generated, a processed product being placed on the placement part;
    a depressurization part positioned below the placement part, and depressurizing inside of the chamber; and
    a supporting part supporting the placement part in an internal space of the chamber,
    the supporting part including
        a mounting part, the mounting part being positioned below the placement part and being provided with the placement part,
        a beam extending from a side surface of the chamber toward a center axis of the chamber inside the chamber, one end of the beam being connected to a side surface of the mounting part, a main space being included inside the beam, the main space being connected to an outside space of the chamber,
    a thickness of a side portion on the placement part side of side portions of the beam is t1, the placement part side of side portions of the beam is from a top of the main space to a top of the beam, t1 is 14 mm to 18 mm,
    a thickness of a side portion on an opposite side of the placement part side of the beam is t2, the opposite side of the placement part side of the beam is from a bottom of the main space to a bottom of the beam, t2 is 8 mm to 10 mm, a distance between an outer wall of the chamber and the center axis of the chamber is L, L is 260 to 350 mm, a weight of the placement part is W, W is 56 to 70 kgf (weight kilogram).

2. The plasma processing apparatus according to claim 1, wherein a flowing formula is satisfied, t1<t3, when a thickness of side portions crossing the side portion on the placement part side of the beam is taken as t3.

3. The plasma processing apparatus according to claim 2, wherein the supporting part further includes a flange provided on an outer wall of the chamber, other end of the beam is connected to the flange via a first hole piercing the side surface of the chamber.

4. The plasma processing apparatus according to claim 3, wherein the mounting part and the beam provided with the placement part are able to be carried in the chamber and carried out of the chamber.

5. The plasma processing apparatus according to claim 4, wherein the depressurization part includes a pump connected to a second hole provided in a bottom plate of the chamber, a valve disc provided inside the chamber and confronting the second hole, and a drive part changing a position of the valve disc in a direction of the center axis of the chamber.

6. The plasma processing apparatus according to claim 5, further comprising:

a fan blowing toward inside the supporting part.

7. The plasma processing apparatus according to claim 1, wherein the supporting part further includes a flange provided on an outer wall of the chamber, other end of the beam is connected to the flange via a first hole piercing the side surface of the chamber.

8. The plasma processing apparatus according to claim 7, wherein the mounting part and the beam provided with the placement part are able to be carried in the chamber and carried out of the chamber.

9. The plasma processing apparatus according to claim 1, wherein the depressurization part includes a pump connected to a second hole provided in a bottom plate of the chamber, a valve disc provided inside the chamber and confronting the second hole, and a drive part changing a position of the valve disc in a direction of the center axis of the chamber.

10. The plasma processing apparatus according to claim 1, further comprising:

a fan blowing toward inside the supporting part.

11. The plasma processing apparatus according to claim 1, further comprising:

a cover is provided on an end face on an opposite side of the placement part side of the mounting part, a diameter dimension of the placement surface on the placement part is φA, φA is 315 mm to 450 mm, a dimension from a center of gravity w of a placement module to the placement surface is H1, H1 is 100 mm to 150 mm, a dimension from an upper surface of the placement part to a lower surface of the cover is H2, H2 is 280 mm to 360 mm, a dimension from a center of gravity w to an upper side surface of a side portion is H3, H3 is −10 mm to 20 mm, a dimension of the beam in a vertical direction is H4, H4 is 80 mm to 110 mm.

12. The plasma processing apparatus according to claim 1, wherein the beam is a square tube.

13. The plasma processing apparatus according to claim 1, wherein a shape of the main space is similar to a shape of the beam.

* * * * *